United States Patent [19]

Collins et al.

[11] Patent Number: 5,800,871
[45] Date of Patent: Sep. 1, 1998

[54] ELECTROSTATIC CHUCK WITH POLYMERIC IMPREGNATION AND METHOD OF MAKING

[75] Inventors: Kenneth S. Collins, San Jose; Joshua Chiu-Wing Tsui, Santa Clara; Douglas Buchberger, Tracy, all of Calif.

[73] Assignee: Applied Materials, Inc., Santa Clara, Calif.

[21] Appl. No.: 689,947

[22] Filed: Aug. 16, 1996

Related U.S. Application Data

[62] Division of Ser. No. 372,177, Jan. 12, 1995.

[51] Int. Cl.$^6$ .................................................... B05D 3/02
[52] U.S. Cl. ............................................. 427/385.5; 427/409
[58] Field of Search ..................... 156/275.5; 427/385.5, 427/409

[56] References Cited

U.S. PATENT DOCUMENTS

| | | | |
|---|---|---|---|
| 4,384,918 | 5/1983 | Abe | 156/643 |
| 4,480,284 | 10/1984 | Tojo | 361/234 |
| 4,645,218 | 2/1987 | Ooshio | 279/128 |
| 4,665,463 | 5/1987 | Ward | 361/234 |
| 4,832,781 | 5/1989 | Mears | 156/345 |
| 5,055,964 | 10/1991 | Logan | 361/234 |
| 5,104,834 | 4/1992 | Watanabe | 501/127 |
| 5,117,121 | 5/1992 | Watanbe | 307/130 |
| 5,151,845 | 9/1992 | Watanabe | 361/234 |
| 5,166,856 | 11/1992 | Liporace | 361/233 |
| 5,191,506 | 3/1993 | Logan | 361/234 |
| 5,275,683 | 1/1994 | Arami | 156/345 |
| 5,280,156 | 1/1994 | Niori | 219/385 |
| 5,315,473 | 5/1994 | Collins | 361/234 |
| 5,324,053 | 6/1994 | Kubota | 279/128 |
| 5,325,261 | 6/1994 | Horwitz | 361/234 |
| 5,350,479 | 9/1994 | Collins | 156/345 |
| 5,382,469 | 1/1995 | Kubota | 428/332 |

FOREIGN PATENT DOCUMENTS

| | | |
|---|---|---|
| 635869 | 4/1994 | European Pat. Off. . |
| 439000 | 9/1994 | European Pat. Off. . |
| 227748 | 1/1990 | Japan . |
| 4367247 | 12/1992 | Japan . |

OTHER PUBLICATIONS

Daviet, et al., "Electrostatic Clamping Applied to Semiconductor Plasma Processing–1.Theoretical Modeling", J. Electrochem. Soc. 140(11):3245–3255, Nov. 1993.
Daviet, et al., "Electrostatic Clamping Applied to Semiconductor Plasma Processing–2.Experimental Results", J. Electrochem. Soc. 140(11):3256–3261, Nov. 1993.
Nakasuji, "Low Voltage and High Speed Operating Electrostatic Wafer Chuck", J. Vac. Sci. Technol. A, 10(6):3573–3578, Nov. 1993.
Watanabe, "Effect of Additives on the Electrostatic Force of Alumina Electrostatic Chucks", J. Ceram. Soc Japan, 100(1):1–6, 1992.
Watanabe, "Electrostatic Force and Absorption Current of Alumina Electrostatic Chucks", Jpn. J. App. Phys., 31(Pt. 1, No. 2):2145–2150, 1992.
Watanabe, "Relationship Between Electrical Resistivity and Electrostatic Force of Alumina Electrostatic Chucks", Jpn. Jp. Appl. Phys., 32(Pt. 1, No. 2):864–871, 1993.
Watanabe, "Resistivity and Microstructure of Alumina Ceramics Added with TiO2 Fired in Reducing Atmosphere", J. of the Ceramic Soc. of Jpn Int. Ed., 101:1076–1083, 1992.
Wright, "Low Temperature Etch Chuck: Modeling and Experimental Results of Heat Transfer and Wafer Temperature", J. Vac. Sci. Technol. A, 10(4):1065–1070, 1992.
U.S. Patent Application Ser. No. 08/372,177, filed Jan. 12, 1995.
U.S. Patent Application Ser. No. 08/475,368, filed Jun. 7, 1995.
U.S. Patent Application Ser. No. 08/639,156, filed Apr. 26, 1996.

*Primary Examiner*—Timothy M. Speer
*Attorney, Agent, or Firm*—Ashok K. Janah; Peter J. Sgarbossa

[57] ABSTRACT

An electrostatic chuck includes a pedestal having a metallic upper surface, and a layer of a porous dielectric material formed on said upper surface of the pedestal. The dielectric layer is impregnated with a plasma-resistant sealant.

15 Claims, 2 Drawing Sheets

ELECTROSTATIC CHUCK WITH POLYMERIC IMPREGNATION AND METHOD OF MAKING

This is a division of the application Ser. No. 08/372,177, filed Jan. 12, 1995 allowed.

BACKGROUND OF THE INVENTION

1. Field of the Invention

The present invention relates to an improved electrostatic chuck and to a method of making the same. More specifically, the invention relates to an electrostatic chuck having a porous dielectric layer which is impregnated with a plasma-resistant sealant material.

2. Description of the Related Art

In the plasma processing of articles such as semiconductor wafers, a common problem is the coupling of electrical energy to the article being processed. Typically, electromagnetic coupling of RF energy into the source region of a plasma chamber is employed to generate and maintain a high electron density plasma having a low particle energy. In addition, RF bias energy is usually capacitively coupled in the plasma via the article being processed to increase and control the energy of ions impinging on the article.

In a typical high density plasma reactor, the driving point RF bias impedance presented by the plasma is very low. To achieve uniform ion energy and flux to the article being processed (typically essential for etching or other plasma processes), uniform coupling of RF bias energy through the article being processed to the plasma is required. The article, typically a semiconductor wafer, being processed normally is held against a of chuck and RF bias energy is applied to the chuck. What is desired is a constant plasma sheath voltage across the surface of the wafer being processed.

The degree to which such a uniform plasma sheath voltage can be achieved is a function not only of the plasma density uniformity as generated by the plasma source, but is also a function of the impedance per unit area of the plasma sheath adjacent to the wafer, the impedance per unit area of the wafer, the impedance per unit area of any gap between the wafer and the chuck and the impedance per unit area of the chuck.

Besides electrical coupling, the chuck should be tightly thermally coupled to the wafer being processed. Typically the temperature of the article is a process parameter to be controlled and this normally means removing heat from or adding heat to the wafer during processing. Heat transfer in a low pressure or vacuum environment such as that used for plasma processing is generally poor. Some means of providing for adequate heat transfer between the wafer being processed and adjacent surfaces is usually necessary.

Gas is typically introduced between the wafer and chuck to enhance thermal contact and heat transfer from the wafer to the chuck. The gas pressure required is a function of the heat load imposed by the plasma, the desired maximum wafer temperature, the temperature at which the chuck can be maintained (such as with liquid cooling), the choice of cooling gas and the wafer/gas and gas/chuck accommodation coefficients (measures of how effectively heat is transferred between a gas and a surface). For biased high density plasma applications, helium gas is used as the cooling gas and the gas pressure required is typically in the 5 to 30 torr range.

For "low pressure" plasma processes (those operating in millitorr pressure range), some means must be provided to allow a significantly higher pressure in the region between the wafer and chuck with respect to the ambient pressure in the process chamber. In addition, a leak of cooling gas into the process environment may produce undesirable results.

Prior art mechanical chucks have proven inadequate for use in the plasma processing of articles such as semiconductor wafers. Mechanically clamped chucks suffer from shortcomings such as mismatches in curvatures between the wafer and the chuck, resulting in a variable gap between such surfaces and consequent non-uniform electrical and thermal coupling.

Electrostatic chucks have successfully overcome the non-uniform coupling associated with mechanical chucks. Electrostatic chucks employ the attractive coulomb force between oppositely charged surfaces to clamp together an wafer and a chuck. In principle, with an electrostatic chuck, the force between wafer and chuck is uniform for a flat article and flat chuck. The electrostatic force between the wafer and the chuck is proportional to the square of the voltage between them, proportional to the relative permittivity of the dielectric medium (typically a ceramic such as alumina) separating them (assuming conductivity is negligible) and inversely proportional with the square of the distance between them. Typically for biased-wafer high density plasma processing application (such as $SiO_2$ etching) a cooling gas is required to improve the heat transfer between the wafer and the chuck to acceptable levels.

Introduction of gas cooling between a wafer and a chuck, while required to achieve adequate heat transfer, can cause problems with prior art electrostatic chucks when used in biased-wafer high density plasma applications. In particular, the requirement of introducing cooling gas in the region between an wafer and a chuck requires that some discontinuity be introduced in the chuck surface, typically some type of hole(s) through the chuck to a gas passage behind the chuck surface. The introduction of any discontinuity in the chuck surface distorts the electric field in the vicinity of the discontinuity, making arc breakdown and glow discharge breakdown of the cooling gas more probable. With DC bias applied between an wafer and a chuck, and RF bias applied to the chuck, gas breakdown becomes probable with prior art electrostatic chucks such as described in U.S. Pat. Nos. 4,565,601 and 4,771,730.

The problems of cooling gas breakdown are addressed by the electrostatic chuck described in U.S. Pat. No. 5,350,479, to Collins et al., assigned to Applied Materials, Inc. and incorporated in its entirety herein by reference. With reference to FIGS. 1–4, an electrostatic chuck 10a as described in the foregoing patent comprises an aluminum pedestal 14a within which a plurality of axially oriented lift pin holes 66a and gas conduits 48a having upper ends 50a are defined. The conduits 48a typically have a diameter of about 0.3 inch (8 mm). The conduits 48a preferably do not extend to the upper surface 40a of the pedestal 14a, but are separated from the surface by a thin intervening layer 60a of aluminum. A dielectric layer 44a of alumina or alumina/titania is plasma-sprayed over the upper surface 40a of the pedestal 14a of the electrostatic chuck 10a and ground to achieve a thickness of about 0.010 inch (0.25 mm).

As best shown in FIG. 3, a plurality of perforations 58a having diameters at least an order of magnitude less than the diameter of conduit 48a are formed through the dielectric layer 44a and the intervening aluminum layer 60a into the upper ends 50a of conduits 48a, preferably by laser drilling. These perforations permit transport of cooling gas from each conduit 48a to the surface of the dielectric layer 44a. In order to distribute the cooling gas from the perforations 58a over the upper face 54a of the dielectric layer 44a, a pattern 18a of one or more gas distribution grooves 55a, 56a is formed in the upper face 54a. These grooves are typically produced by a laser machining operation, and extend over the majority of the surface of the upper face 54a of the dielectric layer 44a. Thus, when a semiconductor substrate or other article is placed on the electrostatic chuck 10a, cooling gas flows through the conduits 48a and perforations 58a into the distribution grooves 55a, 56a, thus cooling the substrate or article.

The foregoing electrostatic chuck can be subjected to high power RF fields and high density plasmas immediately above the substrate chucked thereto without breakdown of the cooling gas due to arcing or glow discharge. However, a number of new problems arise in connection with the foregoing electrostatic chuck.

The dielectric layer 44a typically is formed by a plasma-spraying (also known as flame-spraying) process. Plasma-sprayed dielectric layers, typically finished to thicknesses in the range from about 50 to 500 μm, have high dielectric strength in vacuum (>1.5×10$^5$ V/cm).

Plasma-sprayed dielectric layers are, however, somewhat porous, having a typical void fraction of about 1–10%, more usually about 1–2%. The pores of such a dielectric layer form a complex three-dimensionally connected network throughout the dielectric layer. The porosity of such a layer can be characterized as "microporosity" or "macroporosity," or as a combination of both types of porosity. "Microporisity" occurs as a result of the shrinkage of the grains of the plasma-sprayed dielectric material upon cooling. "Macroporosity" occurs primarily as a result of inadequate melting of grains of the dielectric material during the plasma-spraying process.

The network of pores can trap contaminants. More importantly, the network of pores forms a conduction path for any mobile charge which is present in the dielectric layer. For example, plasma-sprayed dielectric layers tend to hydrate upon exposure to air. Mobile charge may be contributed due to this hydration. Charge may also be injected into the layer if the layer is exposed to plasma and an electric field is applied between the electrostatic chuck and the plasma, which is required to establish the electrostatic force by which the substrate is chucked.

The presence of mobile charge in the plasma-sprayed dielectric layer 44a significantly increases the leakage current through the layer at the high electric fields (on the order of 10$^5$ V/cm) typically employed with electrostatic chucks used for plasma processing of semiconductor wafers. The increased leakage current in turn degrades the electrostatic force.

A need has existed for an electrostatic chuck in which the leakage current density is substantially reduced or eliminated even in the presence of moisture or injected charge. A need has also existed for a simple method of making such an improved electrostatic chuck.

SUMMARY OF THE PREFERRED EMBODIMENTS

In accordance with one aspect of the present invention, there is provided an electrostatic chuck having a porous dielectric layer. The dielectric layer is impregnated with a plasma-resistant sealant. The presence of the sealant in the pores of the dielectric layer substantially reduces the observed leakage current density through the sealed dielectric layer.

Preferably, the inventive electrostatic chuck has a leakage current density of less than 1 mA/cm$^2$ at an applied electric field of 2.5×10$^3$ V/cm when tested at 25° C. and 1 atm with a wet deionized water probe.

Preferably, the sealant is a cured liquid polymerizable material, in particular a material that is capable of polymerizing at about 25° C. in the absence of oxygen and at a pressure below 1 atmosphere. The sealant preferably has a low viscosity to enable it adequately to penetrate the pores of the dielectric layer.

In a preferred embodiment, the liquid polymeric material includes at least one monomer having the structural formula I:

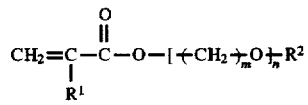

wherein
$R^1$ denotes H or $CH_3$,
$R^2$ denotes H or

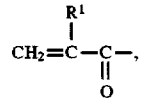

m is 2–4, and
n is 1–22.

In accordance with another aspect of the present invention, an improved electrostatic chuck is produced by impregnating a porous dielectric layer of the chuck with a sealant material capable of being cured to form a plasma resistant material, and curing the impregnated material. Preferably, the curing step is carried out by partially curing the sealant material at ambient temperature in air for about 10 minutes to 8 hours, and subsequently continuing to cure the sealant material in the absence of oxygen at room temperature for about 6 to 24 hours. The foregoing steps can be repeated one or more times if desired. In a preferred embodiment, the sealant material is cured in the absence of oxygen, very preferably under a pressure of less than 1 atmosphere, particularly under a vacuum of about 100 mTorr or less.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which FIG. 1–4 illustrate a known electrostatic chuck wherein FIG. 1 is a top view of a pedestal included in the electrostatic chuck, showing a cooling gas distribution system formed in the upper surface of the dielectric layer bonded to the upper surface of the pedestal, FIG. 2 is a sectional side view along the lines 3—3 in FIG. 1 showing various internal features of the electrostatic chuck of FIG. 1, FIG. 3 is an enlarged illustration of a portion of the pedestal and layer of dielectric material within the circle 4a of FIG. 2, FIG. 4 is an enlarged view of a portion of the upper surface of the pedestal of FIG. 1 showing the relation of gas distribution grooves and perforations.

In the figures, like elements are numbered alike throughout.

DETAILED DESCRIPTION OF THE PREFERRED EMBODIMENTS

Applicants have discovered that application of a plasma-resistant sealant material to a porous dielectric layer of an electrostatic chuck achieves the desired substantial reduction of the observed leakage current. Sealant materials used according to the invention impregnate the porous dielectric layer, filling substantially all of the pores of the porous dielectric layer. The conduction path for the leakage current which characterized previous electrostatic chucks having porous dielectric layers is blocked, substantially reducing the leakage current density.

Figure 1:
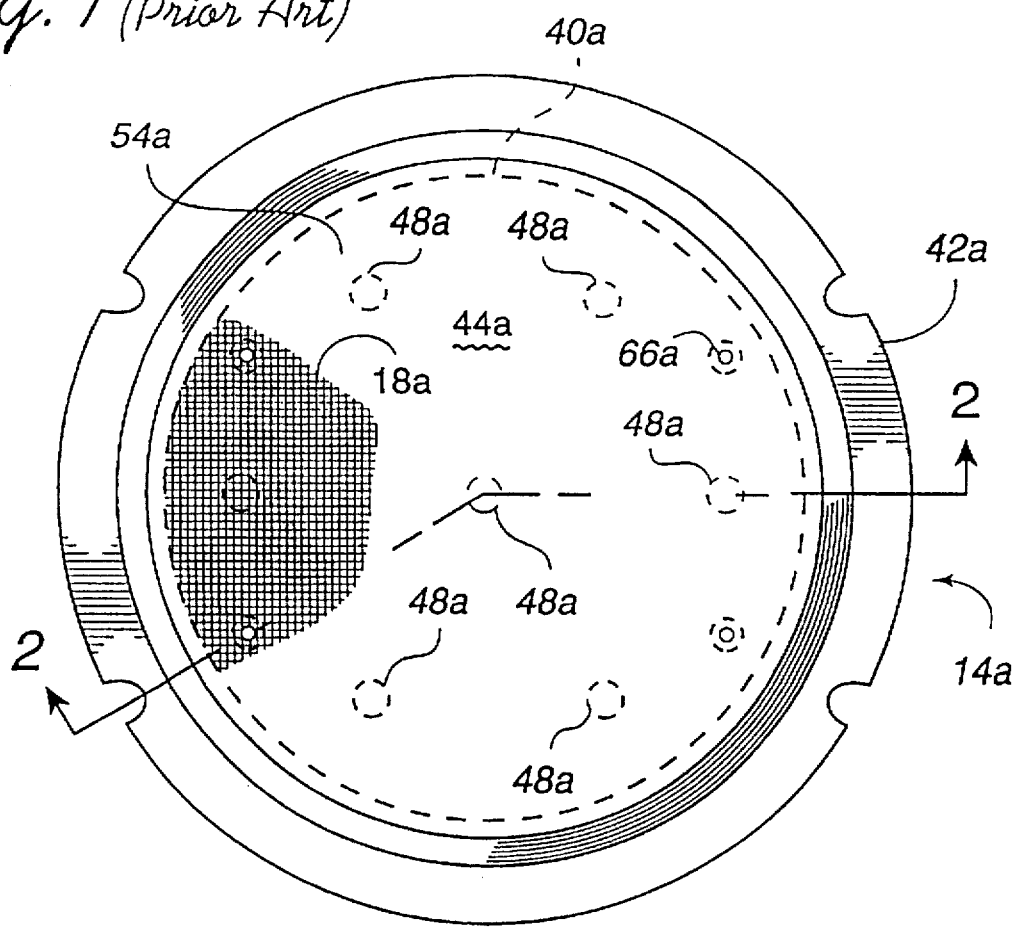
Figure 2:
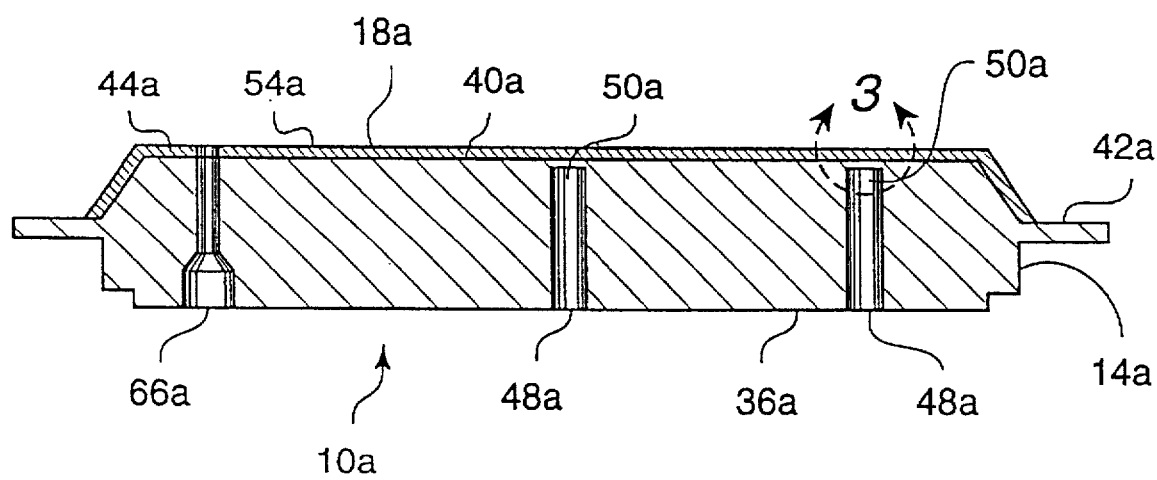
Figure 3:
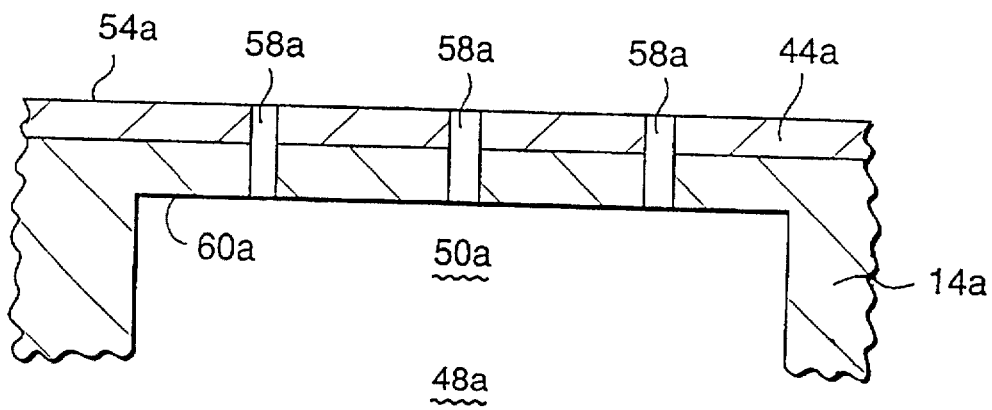
Figure 4:
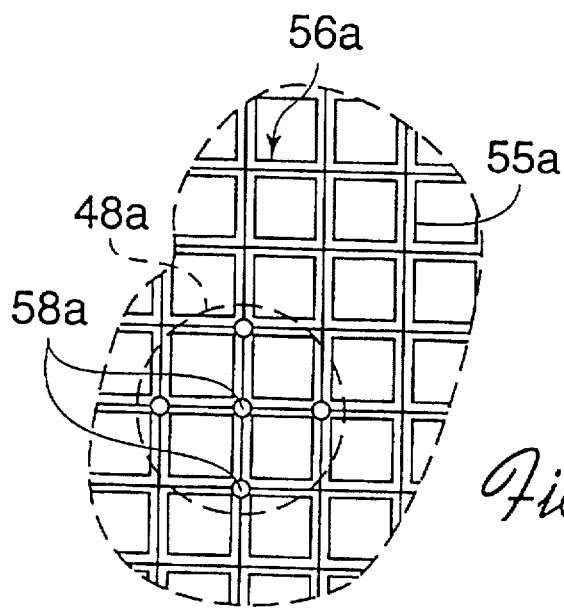
Figure 5:
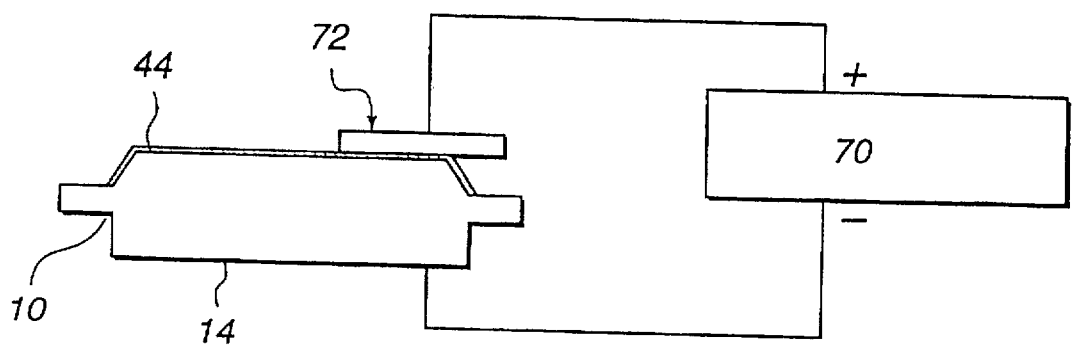
FIG. 5 illustrates a wet deionized water electrical leakage test employed to measure leakage current density in a sealed electrostatic chuck according to the invention.

The effectiveness of a particular sealant in reducing the leakage current density can be assessed using the following "wet" deionized water electrical leakage test. A 100 V DC voltage source 70, which includes a megohm meter, is connected to the metal pedestal 14 of the electrostatic chuck 10 to be tested as shown in FIG. 5. Voltage source 70 is also connected to sponge probe 72, which is saturated with deionized water. Sponge probe 72 has an area of about 6.45 $cm^2$ and is placed in contact with dielectric layer 44 (typically having a thickness that can vary from about 50 to 500 µm) of electrostatic chuck 10. Sponge probe 72 is maintained in contact with dielectric layer 44 for a minimum of 2 minutes, preferably about 2–4 minutes. A test electric field of $2.5 \times 10^3$ V/cm is employed.

The tested sealant is acceptable according to the invention if a leakage current density of less than 1 $mA/cm^2$ is observed. Preferably, the observed leakage current density is less than 1 $\mu A/cm^2$, and very preferably the leakage current density is less than 100 $nA/cm^2$.

The sealant material employed according to the invention also must be resistant to attack and degradation by plasma. The plasma-resistance of a particular sealant can be assessed using the following test procedure. A semiconductor wafer is chucked to an electrostatic chuck, which has been treated with the sealant to be evaluated, in a chamber of a plasma processing apparatus as described in U.S. Pat. No. 5,350, 479. A high density oxygen plasma (100 sccm, 4 mTorr) having an electron density $n_e$ of $5 \times 10^{11}$ electrons/$cm^3$, is produced. A voltage of 1250 V is established between the plasma and the base of the electrostatic chuck, with the plasma being positive and the chuck base being negative. The magnitude of the electric field is approximately $3 \times 10^4$ V/cm.

Helium is used to pressurize the gap between the electrostatic chuck and the semiconductor wafer to 15 Torr.

Over the course of 12-hour plasma exposure, the leakage current density is monitored as described previously. Helium leakage is also monitored.

A sealant is acceptable according to the invention if the observed leakage current throughout the 12-hour plasma exposure does not exceed 1 $mA/cm^2$, more preferably 1 $\mu A/cm^2$, and very preferably 100 $nA/cm^2$, and if the helium leakage does not exceed 10 sccm, preferably 2–3 sccm.

The foregoing test is described in terms of an oxygen plasma. A similar test can be carried out to determine the plasma resistance of a sealant to any desired plasma. For example, oxide etching applications employ fluorine-containg plasmas and optionally oxygen plasmas. Silicon or aluminum etching processes typically employ chlorine-containing plasmas. Various sealants will be useful with fluorine-containing plasmas, while others are more suitable for use with chlorine- or oxygen-containing plasmas. The suitability of any particular sealant can readily be determined by one of ordinary skill by recourse to the testing procedure described above as adapted for the particular plasma of interest.

The sealant material useful according to the invention desirably also have the following properties. The sealant material should be able to penetrate deep into the porous dielectric layer in order to seal the layer effectively. The sealant material should furthermore have a high dielectric strength itself, preferaby approximately the same order of magnitude as that of the dielectric material in the absence of injected charge from plasma or moisture (e.g., about $10^5$ V/cm). Preferably as well, the sealant material should form an effective seal at or near room temperature (25° C.), in order to avoid the necessity for thermal cycling of the electrostatic chuck during fabrication. The sealant material desirably has a low vapor pressure.

Applicants have determined in particular that liquid polymerizable materials which have low viscosity and which can be polymerized or cured anaerobically at or about room temperature, and preferably at pressures less than 1 atmosphere, can be employed to produce sealant materials having the desirable properties as set forth above.

A "liquid polymerizable material" as used herein denotes a material which is liquid at or around room temperature and includes at least one monomer which is capable of being polymerized. The liquid polymerizable material can include a mixture of two or more polymerizable monomers if desired.

The liquid polymerizable material preferably has a low viscosity, in order to facilitate penetration of the material into the porous dielectric layer to fill substantally all of the pores of the layer. Very preferably the liquid polymerizable material fills substantially the entire pore volume.

In general, a liquid polymerizable material has a sufficiently low viscosities if it is capable of penetrating an 0.1 to 1-mm thick sample of the porous dielectric material which forms the layer to be sealed, in a time up to about 1 to 5 minutes. Penetration of the liquid polymerizable material through the layer can be determined by visual or tactile inspection.

Particularly suitable viscosities for liquid polymerizable materials useful according to the invention do not exceed about 50 cps, more preferably falling in the range from about 1–50 cps, very preferably ranging from about 1–10 cps. Materials having higher viscosities are more suitable for sealing predominantly "macroporous" dielectric materials. Conversely, materials having lower viscosities are more suitable for sealing predominantly "microporous" dielectric materials.

Liquid polymeric materials having suitable viscosities are particularly beneficially employed according to the invention if they are also curable at or about room temperature and at, and preferably below, 1 atmosphere, more preferably below about 100 mTorr.

Specific liquid polymerizable materials which are useful according to the invention include at least one (meth) acrylate or di(meth)acrylate monomer having the structural formula 1:

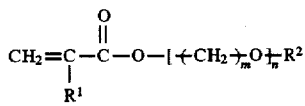  I wherein
$R^1$ denotes H or $CH_3$,
$R^2$ denotes H or

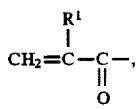

m is 2–4, and
n is 1–22.

In formula I, $R^1$ preferably is $CH_3$. The index m preferably is 2, and the index n preferably is 4–8, very preferably 4.

The liquid polymerizable materials useful according to the invention preferably also include one or more additives conventionally employed with polymerizable mixtures. Such additives include polymerization initiators, accelerators such as organic cyclic sulfimides, e.g., benzoic sulfimide (saccharin) and tertiary amines, e.g., N,N-dialkyltoluidenes such as N,N-dimethyl-p-toluidene, and chelating agents such as sodium EDTA (tetrasodium ethylenediaminetetraacetate). Solvents (preferably non-aqueous solvents) may be used, but generally are not necessary.

Preferably, the liquid polymerizable mixture includes an effective amount of a polymerization initiator or combination of initiators. Such polymerization initiators in particular include free-radical polymerization initiators which are capable of initiating polymerization of the monomer or monomers of the mixture in the substantial absence of oxygen, and yet not initiate polymerization as long as oxygen is present. Initiators having the foregoing characteristics include peroxy initiators, such as peroxides, hydroperoxides and peresters. Hydroperoxy initiators, in particular organic hydroperoxides such as cumene hydroperoxide are particularly preferred.

The amount of initiator used is an effective amount capable of initiating polymerization of the monomer or monomers in the liquid polymerizable mixture under the selected curing conditions (e.g., in air, in the absence of oxygen, etc.). Anaerobic initiators that initiate polymerization in the absence of oxygen but do not initiate polymerization if oxygen is present are particularly preferred. The amount of initiator is in general between about 0.1 and 10 percent by weight of the non-volatile components of the liquid polymerizable composition, more particularly between about 0.5 and 5 percent by weight of the composition.

It is very preferred that the liquid polymerizable mixture have a low level of contaminants that can degrade the performance of semiconductor devices fabricated using an electrostatic chuck of the invention. Such contaminants include metals such as alkali and alkaline earth metals (e.g. sodium, potassium), iron, copper, zinc, etc. The amount of such contaminants in the polymerizable mixture preferably is less than about 1 ppm.

Preferred formulations of liquid polymerizable materials useful according to the invention comprise about 90–99 wt % of a polymerizable monomer or combination of monomers of formula I, about 0.1–10 wt %, more preferably about 2–6 wt %, of a polymerization initiator, and about 0–10 wt %, more preferably 0.1–4 wt %, of an accelerator or combination of accelerators, with all percentages based on the total weight of the non-volatile components of said polymerizable mixture. Preferred monomers according to formula I include the acrylates and dimethacrylates of polyethylene glycol 400 (a product having an average of 9 repeating ethoxy units per polymer), as well as combinations of tetraethylene glycol dimethacrylate and hydroxyethyl methacrylate, for example about 70–90 wt % of tetraethylene glycol dimethacrylate and about 30-10 wt % of hydroxyethyl methacrylate. Preferred accelerator combinations include mixtures of saccharin, N,N-dimethyl-p-toluidene and/or tetrahydroquinoline, for example about 1–3 wt % of saccharin and about 0.1–1 wt % of N,N-dimethyltoluidene.

Specific sealant formulations that are suitable for use according to the instant invention include Loctite 290 and 990 adhesive sealants (commercially available from Loctite Corporation, Newington, Conn.), and Perma-Lok HL 126 (commercially available from Permabond International Corporation, Englewood, N.J.). Additional sealant formulations which can be employed according to the instant invention are described in U.S. Pat. No. 5,256,450, to Catena, which is incorporated herein in its entirety by reference.

Plasma-resistant sealants can be used according to the invention to impregnate any porous dielectric material employed to form the dielectric layer of an electrostatic chuck. Typical porous dielectric material employed for such purposes include plasma-sprayed alumina and alumina/titania, for example 97% alumina/3% titania.

The porous dielectric layer of the electrostatic chuck can be impregnated with the selected sealant according to the invention in any desired way. In the preferred embodiment in which the sealant is formed by curing a liquid polymerizable material, the dielectric layer can be impregnated by conventional means such as brushing, spraying, or dipping. The surface of the dielectric layer should be cleaned and dried prior to impregnation. In particular, any machining and drilling residues remaining on the surface of the dielectric layer should be removed.

Impregnation is followed by a curing step in which the liquid polymerizable material is polymerized within the pores of the dielectric layer. The cure step preferably is carried for about 8 to 48 hours at room temperature.

When the selected liquid polymerizable material is an anaerobically curable material, the cure step preferably is carried out in the absence of oxygen. Very preferably, the cure step is at least partially carried out under reduced pressure, particularly in a vacuum of about 100 mTorr or less. Curing can initially be carried out in the presence of air and at atmospheric pressure, followed by a continuation of the curing step in the absence of oxygen under reduced pressure. Curing the liquid polymerizable material under reduced pressure generally is beneficial in reducing the time required for cure.

Beneficially, the impregnation and cure steps are repeated sequentially at least twice, in order to assure that substantially all of the pores of the porous dielectric material are filled by the sealant.

The impregnation and cure steps can be carried out at any point during manufacture of the electrostatic chuck. When a liquid polymerizable material is employed, the material can be applied immediately after formation of the porous dielectric layer of the electrostatic chuck, e.g., after plasma spraying; after the dielectric layer is ground to the final desired thickness; after completion of any drilling and machining steps, e.g., after formation of perforations, gas distribution grooves, etc. If a liquid polymerizable material is applied after drilling and machining of the electrostatic chuck, care should be exercised to ensure that the material does not seal any of the drilled or machined structures. Preferably, all drilled and machined structures are purged, for example with nitrogen at about 60–90 psia, in order to prevent undesired sealing.

The invention is further described by reference to the following non-limiting examples.

Examples 1–2 set forth sealants which are useful according to the instant invention.

| Ingredient | Example 1[a] | Example 2[b] |
|---|---|---|
| Polyglycol dimethacrylate (CAS No. 25852-47-5) | 90–95 wt % | |
| Tetraethylene glycol dimethacrylate (CAS No. 109-17-1) | | 75 wt % |
| Hydroxyethyl methacrylate (CAS No. 868-77-9) | | 15 wt % |
| Cumene hydroperoxide | 3–5 wt % | 3 wt % |
| Saccharin | 1–3 wt % | 3 wt % |
| N,N-dialkyltoluidenes (CAS No. 613-48-9) | 0.1–1 wt % | |
| N,N-dimethyl-p-toluidene (CAS No. 99-97-8) | | 1 wt % |

[a]Commercially available from Loctite Corp. as Product 990
[b]Commercially available from Permabond Intl. as Perma-Lok HL 126

EXAMPLE 3

An electrostatic chuck having a porous dielectric layer comprised of 97 wt % alumina/3 wt % titania (thickness 0.18 mm) in which helium distribution grooves and perforations are formed as described in U.S. Pat. No. 5,350,479, is sealed according to the invention using the following procedure.

Residues from the drilling and machining processes used to form the grooves and perforations are removed by manually shaving across the upper surface of the dielectric layer with a clean, sharp-edged alumina ceramic plate while the helium distribution system of the chuck is purged with clean, dry nitrogen (90 psia). The chuck is then thoroughly cleaned using isopropyl alcohol, wiped with a clean, lint-free cloth, and blow-dried with clean, dry nitrogen. The cleaned and dried chuck is immediately placed in a vacuum chamber at 30 mTorr for 60 minutes.

Next, the helium distribution system of the chuck is again purged with clean, dry nitrogen at 90 psia. While the nitrogen is flowing, 20–30 cm$^3$ of Perma-Lok HL 126 are applied uniformly to the surface of the dielectric layer of the chuck using a clean, lint-free cloth. After 30 minutes, the nitrogen purge is stopped, and the chamber is evacuated to 30 mTorr. After 8 hours, a second coating of the sealant is applied, followed by nitrogen purge cessation and chamber evacuation as described.

Optionally, after another 8 hours, a third coating can be applied by repeating the foregoing steps.

EXAMPLE 4

A sealed electrostatic chuck produced according to Example 3 of the invention was compared with an otherwise identical electrostatic chuck which was not sealed.

The unsealed and sealed chucks were tested using two procedures, "wet" and "dry". The "wet" test procedure is described above. The "dry" test procedure is similar to the "wet" test procedure, but a planar copper electrode having an area of 6.45 cm$^2$ is used instead of a sponge probe. The chucks are also treated to remove residual moisture prior to measurement in the "dry" test. The chucks are baked at 105° C. for at least 30 minutes, then placed in a vacuum chamber evacuated to 30 mTorr for at least 30 minutes, and subsequently cooled to 25° C. in a dry environment. Testing is carried out at a pressure of 1 atmosphere.

All measurements were made at 2 minutes dwell time per data point.

For each test procedure, the test voltave (V) was forced, the current (I) or the resistance (R) was measured, and the electric field (E) and current density (J) were calculated on the basis of the foregoing measurements. Results are set forth in Tables I–IV below.

TABLE I

Unsealed chuck, dry test

| V (volts) | R (ohms) | I (amps) | E (V/cm) | J (A/cm$^2$) |
|---|---|---|---|---|
| 100 | >10$^{10}$ | <1.5 × 10$^{-9}$ | 5.6 × 10$^3$ | <0.23 × 10$^{-9}$ |
| 250 | >10$^{10}$ | <3.9 × 10$^{-9}$ | 13.9 × 10$^3$ | <0.60 × 10$^{-9}$ |
| 500 | >10$^{10}$ | <7.8 × 10$^{-9}$ | 27.8 × 10$^3$ | <1.30 × 10$^{-9}$ |
| 1000 | >10$^{10}$ | <1.5 × 10$^{-8}$ | 55.6 × 10$^3$ | <2.33 × 10$^{-9}$ |
| 2500 | 10$^8$ | 3.8 × 10$^{-6}$ | 139 × 10$^3$ | 0.59 × 10$^{-6}$ |
| 5000 | 0 | short | 278 × 10$^3$ | short |

TABLE II

Unsealed chuck, wet test

| V (volts) | R (ohms) | I (amps) | E (V/cm) | J (A/cm$^2$) |
|---|---|---|---|---|
| 100 | 0 | short | 5.6 × 10$^3$ | short |
| 250 | 0 | short | 13.9 × 10$^3$ | short |
| 500 | 0 | short | 27.8 × 10$^3$ | short |
| 1000 | 0 | short | 55.6 × 10$^3$ | short |
| 2500 | 0 | short | 139 × 10$^3$ | short |
| 5000 | 0 | short | 278 × 10$^3$ | short |

TABLE III

Sealed chuck, dry test

| V (volts) | R (ohms) | I (amps) | E (V/cm) | J (A/cm$^2$) |
|---|---|---|---|---|
| 100 | >10$^{10}$ | <1.5 × 10$^{-9}$ | 5.6 × 10$^3$ | <0.23 × 10$^{-9}$ |
| 250 | >10$^{10}$ | <3.9 × 10$^{-9}$ | 13.9 × 10$^3$ | <0.60 × 10$^{-9}$ |
| 500 | >10$^{10}$ | <7.8 × 10$^{-9}$ | 27.8 × 10$^3$ | <1.30 × 10$^{-9}$ |
| 1000 | >10$^{10}$ | <1.5 × 10$^{-8}$ | 55.6 × 10$^3$ | <2.33 × 10$^{-9}$ |
| 2500 | >10$^{10}$ | <3.8 × 10$^{-8}$ | 139 × 10$^3$ | <5.9 × 10$^{-9}$ |
| 5000 | >10$^{10}$ | <7.7 × 10$^{-8}$ | 278 × 10$^3$ | <11.9 × 10$^{-9}$ |

TABLE IV

Sealed chuck, wet test

| V (volts) | R (ohms) | I (amps) | E (V/cm) | J (A/cm$^2$) |
|---|---|---|---|---|
| 100 | >10$^{10}$ | <1.5 × 10$^{-9}$ | 5.6 × 10$^3$ | <0.23 × 10$^{-9}$ |
| 250 | >10$^{10}$ | <3.9 × 10$^{-9}$ | 13.9 × 10$^3$ | <0.60 × 10$^{-9}$ |
| 500 | >10$^{10}$ | <7.8 × 10$^{-9}$ | 27.8 × 10$^3$ | <1.30 × 10$^{-9}$ |
| 1000 | >10$^{10}$ | <1.5 × 10$^{-8}$ | 55.6 × 10$^3$ | <2.33 × 10$^{-9}$ |

TABLE IV-continued

| | | Sealed chuck, wet test | | |
|---|---|---|---|---|
| V (volts) | R (ohms) | I (amps) | E (V/cm) | J (A/cm$^2$) |
| 2500 | >10$^{10}$ | <3.8 × 10$^{-8}$ | 139 × 10$^3$ | <5.9 × 10$^{-9}$ |
| 5000 | >10$^{10}$ | <7.7 × 10$^{-8}$ | 278 × 10$^3$ | <11.9 × 10$^{-9}$ |

As is evident from the foregoing comparison, the unsealed electrostatic chuck performs acceptably according to the dry test for voltages up to about 2500 V, at which point the leakage current across the dielectric layer becomes excessive. However, the unsealed chuck fails the wet test at all voltages, showing the presence of unacceptable conduction paths due to the connected porosity of the unsealed dielectric layer. Thus, the unsealed ceramic coating exhibits high dielectric strength in the absence of injected charge, but in the presence of injected charge the dielectric strength is inadequate for use as a dielectric layer on an electrostatic chuck.

In contrast, the sealed electrostatic chuck according to the invention is characterized by very small leakage current densities at all voltages, whether measured according to the dry or wet test. The low leakage currents observed in the wet test indicate that the connected porosity of the dielectric layer has been substantially completely filled.

The present invention thus provides an improved electrostatic chuck in which leakage current density is significantly reduced. The improved chucks thus show extended service life and higher reliability.

What is claimed is:

1. A method of producing an electrostatic chuck which comprises the steps of:
   (a) providing an electrostatic chuck comprising
     (i) a pedestal having a metallic upper surface, and
     (ii) a porous dielectric formed on said upper surface of said pedestal,
   (b) impregnating substantially the entire porous dielectric with a liquid polymerizable material capable of being cured to form a plasma-resistant material, the liquid polymerizable material comprising at least one monomer having the structural formula:

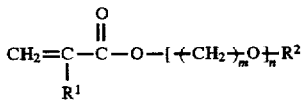

wherein
R$^1$ denotes H or CH$_3$,
R$^2$ denotes H or

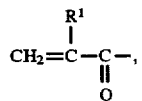

m is 2–4, and
n is 1–22; and
   (c) curing said impregnated liquid polymerizable material.

2. The method of claim 1 wherein said curing step (c) is carried out by (i) partially curing said liquid polymerizable material at room temperature in air for about 10 minutes to 8 hours, and subsequently (ii) continuing to cure said liquid polymerizable material in the absence of oxygen at room temperature for about 6 to 24 hours.

3. The method of claim 2 wherein said curing step (c)(ii) is carried out under a pressure of less than 1 atm.

4. The method of claim 2 wherein steps (b) and (c) are sequentially repeated at least twice.

5. The method of claim 1 wherein said liquid polymerizable material comprises about 90–99 wt % of a polyethylene glycol dimethacrylate, about 2–6 wt % of a polymerization initiator, and about 0–7 wt % of an additive selected from the group consisting of saccharin, an N,N-dialkyltoluidene and mixtures thereof, with all percentages based on the total weight of the non-volatile components of said polymerizable material.

6. The method of claim 1 wherein said liquid polymerizable material comprises about 70–80 wt % of tetraethylene glycol dimethacrylate, about 20-10 wt % of hydroxyethyl methacrylate, about 2–6 wt % of a polymerization initiator, and about 0–7 wt % of an additive selected from the group consisting of saccharin, an N,N-dialkyltoluidene and mixtures thereof, with all percentages based on the total weight of the non-volatile components of said polymerizable material.

7. A method of making an electrostatic chuck comprising the steps of:
   (a) forming a metallic pedestal having an upper surface;
   (b) forming a porous dielectric layer capable of being attached to the upper surface of the pedestal;
   (c) impregnating substantially all the porous dielectric layer with a liquid polymerizable material that is cured to form a plasma-resistant dielectric layer, the liquid polymerizable material comprising at least one monomer having the structural formula:

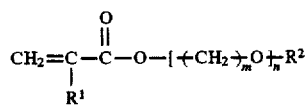

wherein
R$^1$ denotes H or CH$_3$,
R$^2$ denotes H or

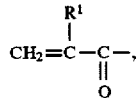

m is 2–4, and
n is 1–22; and
   (d) curing the liquid polymerizable material and attaching the plasma resistant dielectric layer to the upper surface of the metallic pedestal.

8. The electrostatic chuck of claim 7, wherein the plasma-resistant sealant comprises a liquid polymerizable material having a viscosity sufficiently low to fill substantially the entire pore volume of the layer of porous dielectric material.

9. The electrostatic chuck of claim 8, wherein the liquid polymerizable material comprises a viscosity of less than about 50 cps.

10. The electrostatic chuck of claim 7, wherein the plasma-resistant sealant comprises dielectric layer comprises a dielectric strength having a value of at least the same order of magnitude as the porous dielectric layer.

11. The electrostatic chuck of claim 10, wherein the plasma-resistant dielectric layer comprises a dielectric strength of at least about 10$^5$ V/cm.

12. The method of claim 7, wherein step (d) comprises the step of curing the impregnated layer by the steps of: (i) partially curing the liquid polymerizable material in air for about 10 minutes to eight hours; and (ii) continuing to cure the liquid polymerizable material in the absence of oxygen for about six to 24 hours.

13. The method of claim 12, wherein the curing step (ii) is carried out at pressures of less than about 1 atmosphere.

14. The method of claim 7, wherein the liquid polymerizable material comprises about 90–99 wt % of a polyethylene glycol dimethacrylate, about 2–6 wt % of a polymerization initiator, and about 0–7 wt % of an additive selected from the group consisting of saccharin, an N,N-dialkyltoluidene and mixtures thereof, with all percentages based on the total weight of the non-volatile components of the liquid polymerizable material.

15. The method of claim 7, wherein the liquid polymerizable material comprises about 70–80 wt % of tetrathylene glycol dimethacrylate, about 20-10 wt % of hydroxyethyl methacrylate, about 2–6 wt % of a polymerization initiator, and about 0–7 wt % of an additive selected from the group consisting of saccharin, an N,N-dialkyltoluidene and mixtures thereof, with all percentages based on the total weight of the non-volatile components of the liquid polymerizable material.

* * * * *